US008371318B2

(12) United States Patent
Minami et al.

(10) Patent No.: US 8,371,318 B2
(45) Date of Patent: Feb. 12, 2013

(54) LIQUID PROCESSING APPARATUS, LIQUID PROCESSING METHOD, AND STORAGE MEDIUM

(75) Inventors: Teruomi Minami, Koshi (JP); Norihiro Ito, Koshi (JP); Yuji Kamikawa, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/591,877

(22) Filed: Aug. 22, 2012

(65) Prior Publication Data

US 2012/0312332 A1  Dec. 13, 2012

Related U.S. Application Data

(62) Division of application No. 12/222,871, filed on Aug. 18, 2008.

(30) Foreign Application Priority Data

Aug. 31, 2007 (JP) ................................ 2007-225868

(51) Int. Cl.
*B08B 3/00* (2006.01)
(52) U.S. Cl. ....................................... 134/95.2; 134/902
(58) Field of Classification Search ................. 134/95.2
See application file for complete search history.

(56) References Cited

U.S. PATENT DOCUMENTS

| 6,159,288 A | 12/2000 | Satou et al. |
|---|---|---|
| 2004/0003828 A1 | 1/2004 | Jackson |
| 2004/0144316 A1 | 7/2004 | Lee et al. |
| 2004/0180141 A1 | 9/2004 | Kobayashi et al. |
| 2007/0123047 A1 | 5/2007 | Shirasu et al. |

FOREIGN PATENT DOCUMENTS

| JP | 2-5524 | 1/1990 |
|---|---|---|
| JP | 2001-127032 | 5/2001 |
| JP | 2002-172366 | 6/2002 |
| JP | 2002-329696 | 11/2002 |
| JP | 2003-282417 | 10/2003 |
| JP | 2004-304138 A | 10/2004 |
| JP | 2005-85782 | 3/2005 |
| JP | 2005-515613 | 5/2005 |
| JP | 2007-149890 | 6/2007 |
| WO | 02/095809 | 11/2002 |
| WO | 2008-013118 A1 | 1/2008 |

OTHER PUBLICATIONS

Japanese Office Action issued on Apr. 22, 2011 for Application No. 2007-225868 w/ English language translation.

*Primary Examiner* — Michael Barr
*Assistant Examiner* — Jason Ko
(74) *Attorney, Agent, or Firm* — Smith, Gambrell & Russell, LLP (57) ABSTRACT

A liquid processing apparatus 1 comprises a casing 5, a substrate holding mechanism 20 that holds a wafer (substrate to be processed) W, a process-liquid supplying mechanism 30 that supplies a process liquid, a draining cup 12 that receives a process liquid, and a draining pipe 13 that discharges a process liquid outside. The process-liquid supplying mechanism 30 includes a first chemical-liquid supply mechanism that supplies a hydrofluoric process liquid, and a drying-liquid supplying mechanism that supplies an organic solvent for drying a wafer W. A control part 50 causes the first chemical-liquid supplying mechanism to supply a hydrofluoric process liquid, and then causes the drying-liquid supplying mechanism to supply an organic solvent. In addition, before the control part 50 causes the drying-liquid supplying mechanism to supply an organic solvent, the control part causes a cleaning mechanism 10 to remove an alkaline component in a casing 5.

3 Claims, 7 Drawing Sheets

LIQUID PROCESSING APPARATUS, LIQUID PROCESSING METHOD, AND STORAGE MEDIUM

CROSS REFERENCE TO RELATED APPLICATION

This application is a division of Ser. No. 12/222,871 filed Aug. 18, 2008, which is being incorporated in its entirety herein by reference.

CROSS REFERENCE TO RELATED APPLICATIONS

This application is based upon and claims the benefit of priority from the prior Japanese Patent Application No. 2007-225868 filed on Aug. 31, 2007, the entire contents of which are incorporated herein by reference.

FIELD OF THE INVENTION

The present invention relates to: a liquid processing apparatus; a liquid processing method; and a storage medium storing a computer program executable by a computer for performing the liquid processing method; the apparatus and the method employing a method including a drying step by means of an organic solvent, the drying step after a processing step by means of a hydrofluoric process liquid.

BACKGROUND ART

As a method of removing particles adhering to a wafer to be processed, there has been conventionally known a liquid processing method in which, a solution containing mixture of ammonia and hydrogen peroxide is discharged onto the wafer while the wafer is being rotated, and then hydrofluoric acid is discharged onto the wafer while the wafer is being rotated so as to clean the wafer (see, for example JP 2002-329696A).

In this liquid processing method, the inventors have found that the use of an organic solvent for drying the wafer may generate marks such as watermarks on the wafer. Namely, after the wafer is processed by a process liquid containing an ammonia component (alkaline component) and by hydrofluoric acid, and then the wafer is dried by using an organic solvent, there is a possibility that the wafer has some marks.

Although the mechanism for the generation of marks on a wafer has not been clearly known yet, it is supposed that, when the surface of the wafer, which have been activated by the hydrofluoric acid, is exposed to the organic solvent with the ammonia component (alkaline component) being present in an outside atmosphere, the surface of the wafer is attacked by the ammonia component and the organic solvent.

The result of an experiment conducted by the inventors of the present invention shows that, even when a process liquid formed of an ammonia component (alkaline component) is not used as a process liquid, the presence of only a small amount of an ammonia component in the outside atmosphere may cause marks on the surface of a wafer W.

DISCLOSURE OF THE INVENTION

The present invention has been made in view of the above circumstances. The object of the present invention is to provide a liquid processing apparatus and a liquid processing method in which, even when a substrate to be processed is processed by a hydrofluoric process liquid and is then dried by an organic solvent, generation of marks on the substrate to be processed can be prevented. The further object of the present invention is to provide a storage medium storing a computer program for performing the liquid processing method.

A liquid processing apparatus of the present invention a liquid processing apparatus comprising: a casing; a substrate holding mechanism disposed in the casing, the substrate holding mechanism being configured to hold a substrate to be processed; a process-liquid supplying mechanism configured to supply a process liquid to the substrate to be processed held by the substrate holding mechanism; a draining cup configured to cover the substrate to be processed held by the substrate holding mechanism in the casing from an outer peripheral side, the draining cup being configured to receive a process liquid that has been used for cleaning the substrate to be processed; and a draining pipe connected to the draining cup, the draining pipe being configured to discharge outside the process liquid having passed through the draining cup; wherein: the process-liquid supplying mechanism has a first chemical-liquid supplying mechanism configured to supply a hydrofluoric process liquid, and a drying-liquid supplying mechanism configured to supply an organic solvent for drying the substrate to be processed; there is provided a removing mechanism configured to remove an alkaline component in the casing, or an invasion preventing mechanism configured to prevent invasion of an alkaline component into the casing; the first chemical-liquid supplying mechanism, the drying-liquid supplying mechanism, and the removing mechanism or the invasion preventing mechanism, are controlled by a control part; the control part causes the first chemical-liquid supplying mechanism to supply a hydrofluoric process liquid, and thereafter the control part causes the drying-liquid supplying mechanism to supply an organic solvent for drying the substrate to be processed; and before the control part causes the drying-liquid supplying mechanism to supply an organic solvent, the control part causes the removing mechanism to remove an alkaline component in the casing, or causes the invasion preventing mechanism to prevent invasion of an alkaline component into the casing.

Due to this structure, even when there is employed a method in which the substrate to be processed is processed by the hydrofluoric process liquid and is then dried by the organic solvent, the alkaline component in the casing can be removed by the removing mechanism, or the invasion of an alkaline component into the casing can be prevented by the invasion preventing mechanism, before the organic solvent is supplied by the drying-liquid supplying mechanism. Therefore, the generation of marks on the substrate to be processed can be prevented.

In the liquid processing apparatus of the present invention, it is preferable that, before the control part causes the first chemical-liquid supplying mechanism to supply a hydrofluoric process liquid, the control part causes the removing mechanism to remove an alkaline component in the casing.

Due to this structure, when the alkaline component in the casing is removed, it is possible to prevent that the surface of the substrate to be processed, which has been activated by the hydrofluoric process liquid, produces an unnecessary reaction. Therefore, the generation of marks on the substrate to be processed can be more reliably prevented.

In the liquid processing apparatus of the present invention, it is preferable that the invasion preventing mechanism is formed of a pressurizing mechanism that increases an air pressure in the casing.

In the liquid processing apparatus of the present invention, it is preferable that the removing mechanism is formed of a cleaning mechanism that supplies a cleaning liquid to the draining cup so as to remove the alkaline component adhering to the draining cup.

In the liquid processing apparatus of the present invention, it is preferable that the process-liquid supplying mechanism has a second chemical-liquid supplying mechanism controlled by the control part, the second chemical-liquid supplying mechanism being configured to supply an alkaline process liquid; and that the control part causes the cleaning mechanism to supply a cleaning liquid to the draining cup so as to remove the alkaline component adhering to the draining cup, after the control part causes the second chemical-liquid supplying mechanism to supply an alkaline process liquid, and before the control part causes the first chemical-liquid supplying mechanism to supply a hydrofluoric process liquid.

In the liquid processing apparatus of the present invention, it is preferable that the liquid processing apparatus further comprises a blocking mechanism disposed in the draining pipe, the blocking mechanism being configured to stop a flow of a process liquid passing through the draining pipe, wherein: the process-liquid supplying mechanism has a cleaning-liquid supplying mechanism configured to supply a cleaning liquid to the substrate to be processed held on the substrate holding mechanism; the cleaning mechanism is composed of the cleaning-liquid supplying mechanism, the draining pipe, and the blocking mechanism; and the control part causes the blocking mechanism to block the draining pipe to store a cleaning liquid in the draining pipe and the draining cup, so as to remove the alkaline component adhering to the draining cup.

Due to this structure, only by closing the blocking mechanism, the cleaning liquid can be supplied to the draining cup, so that the alkaline component adhering to the draining cup can be removed. Thus, the generation of marks on the substrate to be processed can be easily prevented by the inexpensive structure. In addition, since the draining cup can be bathed with the cleaning liquid, the alkaline component adhering to the draining cup can be reliably cleaned and removed. Thus, the generation of marks on the substrate to be processed can be prevented with a high probability.

In the liquid processing apparatus of the present invention, it is preferable that the cleaning mechanism has a cleaning-liquid jetting mechanism configured to jet a cleaning liquid to the draining cup so as to remove the alkaline component adhering to the draining cup.

Due to this structure, by jetting the cleaning liquid toward the draining cup, the alkaline component adhering to the draining cup can be removed. Therefore, the generation of marks on the substrate to be processed can be easily prevented.

In the liquid processing apparatus of the present invention, it is preferable that the liquid processing apparatus further comprises: a gas introducing part disposed in the casing, the gas introducing part being configured to supply a gas to the substrate to be processed held by the substrate holding mechanism from above; and an exhaust cup positioned to surround the draining cup in the casing, the exhaust cup being configured to take thereinto a gas having passed through the substrate to be processed, and then to discharge the gas.

A liquid processing method of the present invention is a liquid processing method using a liquid processing apparatus having a casing: a substrate holding mechanism disposed in the casing, the substrate holding mechanism being configured to hold a substrate to be processed; a process-liquid supplying mechanism configured to supply a process liquid to the substrate to be processed held by the substrate holding mechanism; a draining cup configured to cover the substrate to be processed held by the substrate holding mechanism in the casing from an outer peripheral side, the draining cup being configured to receive a process liquid that has been used for cleaning the substrate to be processed; and a draining pipe connected to the draining cup, the draining pipe being configured to discharge outside the process liquid having passed through the draining cup; the liquid processing method comprising: a holding step in which the substrate to be processed is held by the substrate holding mechanism; a rotating step in which the substrate to be processed held by the substrate holding mechanism is rotated by the rotating mechanism; and a process-liquid supplying step in which a process liquid is supplied by the process-liquid supplying mechanism to the substrate to be processed held by the substrate holding mechanism; wherein: the process-liquid supplying step includes: a first chemical-liquid supplying step in which a hydrofluoric process liquid is supplied; and a drying-liquid supplying step, after the first chemical-liquid supplying step, in which an organic solvent for drying the substrate to be processed is supplied; and before the drying-liquid supplying step, there is performed a removing step in which an alkaline component in the casing is removed, or an invasion preventing step in which invasion of an alkaline component into the casing is prevented.

Due to this method, even when there is employed a method in which the substrate to be processed is processed by the hydrofluoric process liquid and is then dried by the organic solvent, the alkaline component in the casing can be removed by the removing mechanism, or the invasion of an alkaline component into the casing can be prevented by the invasion preventing mechanism, before the substrate to be processed is dried. Therefore, the generation of marks on the substrate to be processed can be prevented.

In the liquid processing method of the present invention, it is preferable that the removing step is performed, before the first chemical-liquid supplying step in which a hydrofluoric process liquid is supplied.

Due to this method, when the alkaline component in the casing is removed, it is possible to prevent that the surface of the substrate to be processed, which has been activated by the hydrofluoric process liquid, produces an unnecessary reaction. Therefore, the generation of marks on the substrate to be processed can be more reliably prevented.

In the liquid processing method of the present invention, it is preferable that the invasion preventing step prevents the invasion of an alkaline component into the casing, by increasing an air pressure in the casing.

In the liquid processing method of the present invention, it is preferable that the removing step removes the alkaline component adhering to the draining cup, by supplying a cleaning liquid to the draining cup.

In the liquid processing method of the present invention, it is preferable that the process-liquid supplying step includes, before the first chemical-liquid supplying step in which a hydrofluoric process liquid is supplied, a second chemical-liquid supplying step in which an alkaline process liquid is supplied; and the alkaline component adhering to the draining cup is removed by supplying a cleaning liquid to the draining cup, after the second chemical-liquid supplying step in which an alkaline process liquid is supplied, and before the first chemical-liquid supplying step in which a hydrofluoric process liquid is supplied.

In the liquid processing method of the present invention, it is preferable that a flow of the cleaning liquid, which has been supplied from the process-liquid supplying mechanism and passes through the draining pipe, is stopped by means of a blocking mechanism disposed in the draining pipe, so that the process liquid is stored in the draining pipe and the draining cup whereby the cleaning liquid is supplied to the draining cup, so as to remove the alkaline component adhering to the draining cup.

Due to this method, only by closing the blocking mechanism, the cleaning liquid can be supplied to the draining cup, so that the alkaline component adhering to the draining cup can be removed. Thus, the generation of marks on the substrate to be processed can be easily prevented by the inexpensive structure. In addition, since the draining cup can be bathed with the cleaning liquid, the alkaline component adhering to the draining cup can be reliably cleaned and removed. Thus, the generation of marks on the substrate to be processed can be prevented with a high probability.

In the liquid processing method of the present invention, it is preferable that the cleaning step removes the alkaline component adhering to the draining cup, by jetting a cleaning liquid to the draining cup.

Due to this method, by jetting the cleaning liquid toward the draining cup, the alkaline component adhering to the draining cup can be removed. Therefore, the generation of marks on the substrate to be processed can be easily prevented.

A storage medium of the present invention is a storage medium storing a computer program executable by a computer to perform a liquid processing method, wherein the liquid processing method using a liquid processing apparatus having: a substrate holding mechanism being configured to hold a substrate to be processed; a process-liquid supplying mechanism configured to supply a process liquid to the substrate to be processed held by the substrate holding mechanism; a draining cup configured to cover the substrate to be processed held by the substrate holding mechanism from an outer peripheral side, the draining cup being configured to receive a process liquid that has been used for cleaning the substrate to be processed; a draining pipe connected to the draining cup, the draining pipe being configured to discharge outside the process liquid having passed through the draining cup; and a casing capable of accommodating at least the substrate holding mechanism and the draining cup; the liquid processing method comprising: a holding step in which the substrate to be processed is held by the substrate holding mechanism; a rotating step in which the substrate to be processed held by the substrate holding mechanism is rotated by the rotating mechanism; and a process-liquid supplying step in which a process liquid is supplied by the process-liquid supplying mechanism to the substrate to be processed held by the substrate holding mechanism; wherein: the process-liquid supplying step includes: a first chemical-liquid supplying step in which a hydrofluoric process liquid is supplied; and a drying-liquid supplying step, after the first chemical-liquid supplying step, in which an organic solvent for drying the substrate to be processed is supplied; and before the drying-liquid supplying step, there is performed a removing step in which an alkaline component in the casing is removed, or an invasion preventing step in which invasion of an alkaline component into the casing is prevented.

Due to this structure, even when there is employed a method in which the substrate to be processed is processed by the hydrofluoric process liquid and is then dried by the organic solvent, the alkaline component in the casing can be removed by the removing mechanism, or the invasion of an alkaline component into the casing can be prevented by the invasion preventing mechanism, before the substrate to be processed is dried. Therefore, the generation of marks on the substrate to be processed can be prevented.

According to the present invention, even when there is employed a method in which the substrate to be processed is processed by the hydrofluoric process liquid and is then dried by the organic solvent, the alkaline component in the casing can be removed, or the invasion of an alkaline component into the casing can be prevented, before the organic solvent is supplied to dry the substrate to be processed. Therefore, the generation of marks on the substrate to be processed can be prevented.

DETAILED DESCRIPTION OF THE INVENTION

First Embodiment

A first embodiment of a liquid processing apparatus, a liquid processing method, and a storage medium, of the present invention is described herebelow with reference to the drawings. FIGS. 1 to 5 show the first embodiment of the present invention.

Figure 1:
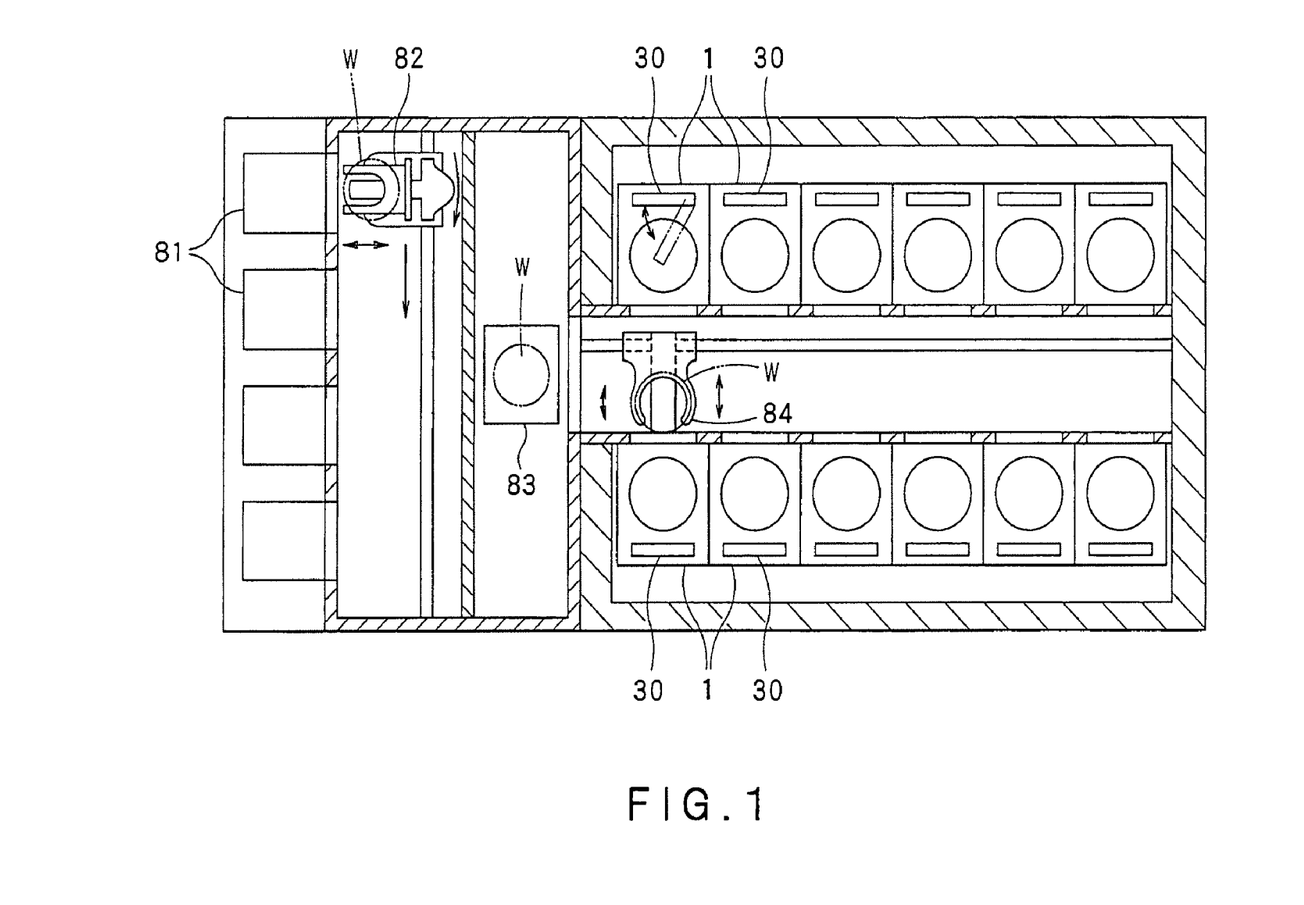
FIG. 1 is an upper plan view of a liquid processing system including liquid processing apparatuses in a first embodiment of the present invention, the liquid processing system being seen from above.

As shown in FIG. 1, a liquid processing system includes: a stage 81 in which a carrier loaded from outside is placed, the carrier accommodating a semiconductor wafer W (hereinafter simply referred to also as "wafer W") that is a substrate to be processed; a transfer arm 82 that takes out the wafer W accommodated in the carrier; a shelf unit 83 on which the wafer W taken out by the transfer arm 82 is placed; and a main arm 84 that receives the wafer W placed on the shelf unit 83 and conveys the wafer W into a liquid processing apparatus 11. Incorporated in the liquid processing system are the plurality of liquid processing apparatuses (twelve in this embodiment). FIG. 1 is an upper plan view of the liquid processing system including the liquid processing apparatuses 1 in this embodiment, the liquid processing system being seen from above.

Figure 2:
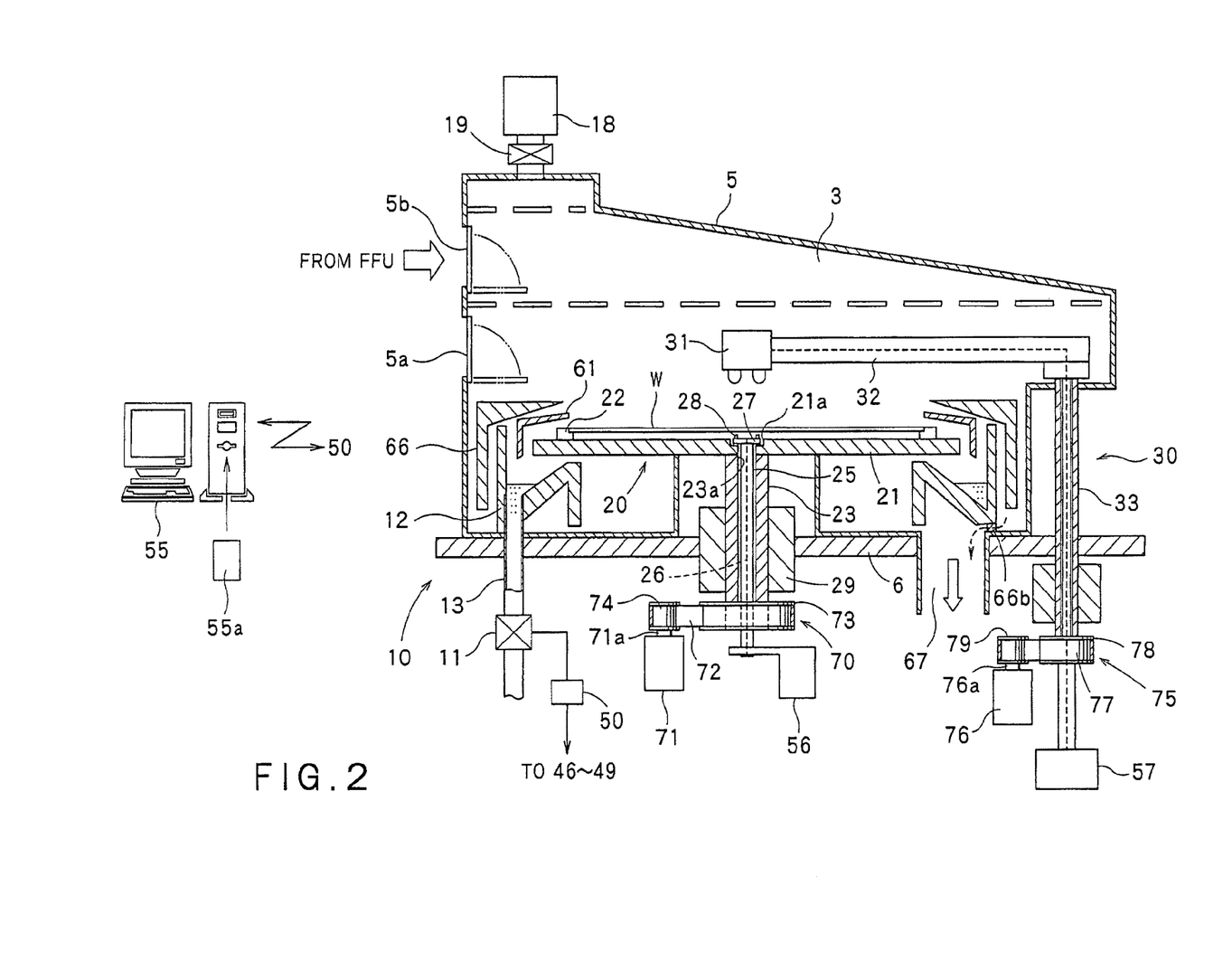
FIG. 2 is a longitudinal sectional view of the liquid processing apparatus in the first embodiment of the present invention.

As shown in FIG. 2, the liquid processing apparatus 1 includes: a casing 5; a substrate holding mechanism 20 disposed in the casing 5, the substrate holding mechanism 20 being configured to hold a wafer W; a process-liquid supplying mechanism 30 configured to supply a process liquid to the wafer W held by the substrate holding mechanism 20; a rotating cup 61 configured to cover the wafer W held by the substrate holding mechanism 20 in the casing 5 from an outer peripheral side, the rotating cup 61 being configured to be capable of rotating integrally with the substrate holding mechanism 20; and a rotating mechanism 70 configured to integrally rotate the rotating cup 61 and the substrate holding mechanism 20. FIG. 2 is a longitudinal sectional view of the liquid processing apparatus 1 in this embodiment.

As shown in FIG. 2, disposed in the casing 5 on an outer peripheral side of the rotating cup 61 is an annular draining cup 12 configured to receive a process liquid that has been used for cleaning a wafer W. Connected to the draining cup 12 is a draining pipe 13 configured to discharge outside the process liquid having passed through the draining cup 12.

As shown in FIG. 2, provided in a sidewall of the casing 5 is an inlet/outlet port 5a through which a wafer W is loaded and unloaded.

Figure 4:
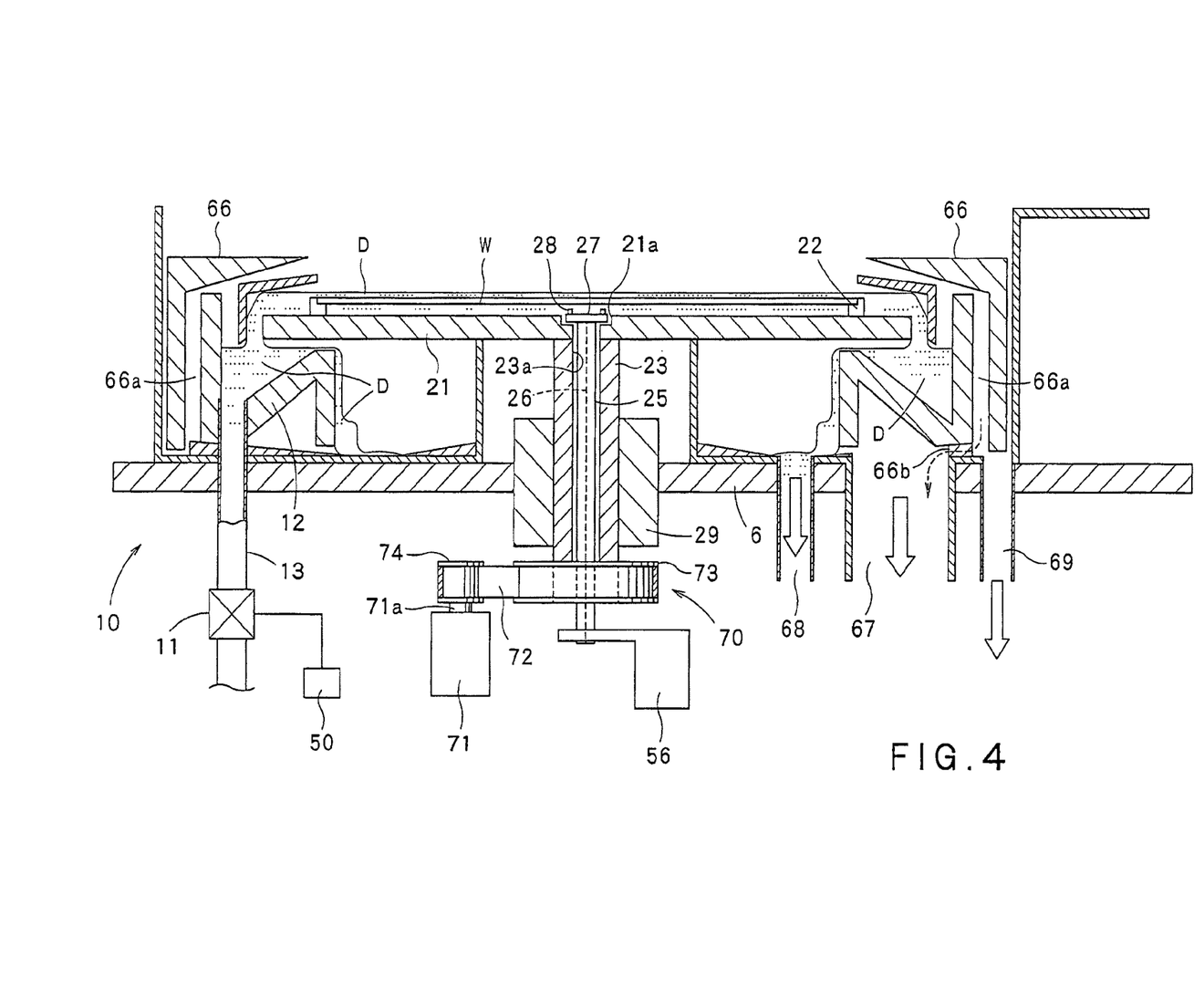
FIG. 4 is another longitudinal sectional view of the liquid processing apparatus, showing a section different from the section shown in FIG. 2.

As shown in FIGS. 2 and 4, the substrate holding mechanism 20 includes: a discoid rotating plate 21 that is horizontally located; a holding member 22 disposed on a peripheral edge of the rotating plate 21, the holding member 22 being configured to hold a wafer W; and a cylindrical rotating shaft 23 connected to a central part of a lower surface of the rotating plate 21 so as to be extended downward. Formed in the central part of the rotating plate 21 is a circular hole 21a that is communicated with a hole 23a of the cylindrical rotating shaft 23. Inside the hole 23a of the rotating shaft 23, there is disposed an elevating member 25 capable of being moved in an up and down direction by an elevating mechanism 56. FIG. 4 is another longitudinal sectional view of the liquid processing apparatus, showing a section different from the section shown in FIG. 2.

As shown in FIGS. 2 and 4, disposed in the elevating member 25 is a rear-surface process-liquid supply path 26 through which a process liquid is supplied from a rear-surface (lower-surface) side of a wafer W. A wafer supporting table 27 is disposed on an upper end of the elevating member 25. A wafer supporting pin 28 for supporting a wafer W is disposed on an upper surface of the wafer supporting table 27. The rotating shaft 23 is rotatably supported on a base plate 6 via a bearing member 29.

As shown in FIGS. 2 and 4, the rotating mechanism 70 includes a motor 71 having a motor shaft 71a, and a belt 72 wound around the motor shaft 71a and around a lower end of the rotating shaft 23. A pulley 74 is disposed between the belt 72 and the motor shaft 71a, and a pulley 73 is disposed between the belt 72 and the rotating shaft 23.

As shown in FIG. 2, disposed in an upper part of the casing 5 is a gas introducing part 3 that introduces a gas from a fan filter unit (FFU) (not shown) of the liquid processing system via an inlet port 5b. Thus, a clean air (gas) can be supplied from above to a wafer W held on the substrate holding mechanism 20. The FFU is provided with a chemical filter for adsorbing an alkaline component, whereby an alkali atmosphere is prevented from entering the casing 5 from outside.

As shown in FIGS. 2 and 4, disposed on an outer peripheral side of the draining cup 12 is an annular exhaust cup 66 that takes thereinto a clean air, which has been supplied from the air introducing part 3 through a wafer W, and discharges the clean air.

Connected to the exhaust cup 66 is one exhaust pipe 67 that discharges outside a gas having passed through the exhaust cup 66. A slit-like ventilation hole 66b is formed in a lower end of the draining cup 12, whereby an air having passed through the exhaust cup 66 is guided to the exhaust pipe 67 (see, dotted arrow in FIG. 2).

Figure 3:
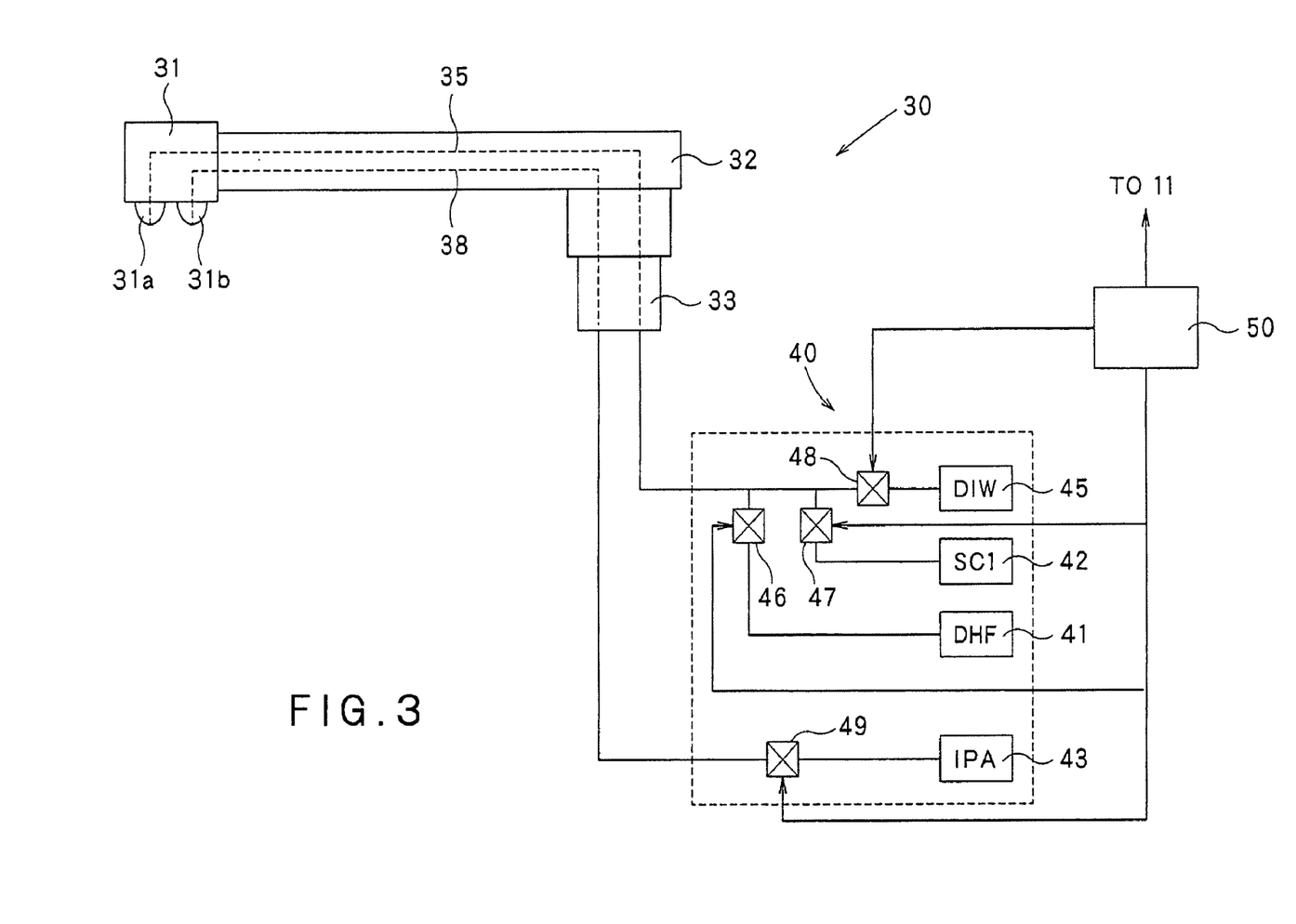
FIG. 3 is a schematic view showing a structure of a process-liquid supplying mechanism of the liquid processing apparatus in the first embodiment of the present invention.

As shown in FIGS. 2 and 3, the process-liquid supplying mechanism 30 includes: a nozzle block 31 having nozzles 31a and 31b configured to supply a process liquid onto a surface of a wafer W held by the substrate holding mechanism 20; a nozzle arm 32 connected to the nozzle block 31, the nozzle arm 32 being configured to move the nozzle block 31 along the surface of the wafer W held by the substrate holding mechanism 20; a nozzle swinging shaft 33 that is vertically extended downward from the nozzle arm 32; and a nozzle driving part 75 configured to drive the nozzle swinging shaft 33. Connected to a lower end of the nozzle swinging shaft 33 is a nozzle elevating mechanism 57 configured to drive the nozzle block 31, the nozzle arm 32, the nozzle swinging shaft 33, and the nozzle driving part 75 in the up and down direction. FIG. 3 is a schematic view showing the structure of the process-liquid supplying mechanism of the liquid processing apparatus 1 in this embodiment.

The nozzle driving part 75 includes a motor 76 provided with a motor shaft 76a, and a belt 77 wound around the motor shaft 76a and around a lower end of the nozzle swinging shaft 33. A pulley 79 is disposed between the belt 77 and the motor shaft 76a, and a pulley 78 is disposed between the belt 77 and the nozzle swinging shaft 33.

As shown in FIG. 3, inside the nozzle block 31 having the nozzles 31a and 31b, the nozzle arm 32, and the nozzle swinging shaft 33, which are disposed in the process-liquid supplying mechanism 30, there are disposed a process-liquid flow path through which a process liquid passes, and a dry-solvent flow path 38 through which a dry solvent passes. The process-liquid flow path 35 and the dry-solvent flow path 38 are communicated with the process-liquid supplying part 40.

The process-liquid supplying part 40 includes: a DHF supply source 41 configured to supply a hydrofluoric chemical liquid such as diluted hydrofluoric acid (DHF); an SC1 supply source 42 configured to supply an alkaline chemical liquid such as ammonia peroxide mixture (SC1); a DIW supply source configured to supply a rinse liquid such as deionized water (DIW); and an IPA supply source 43 configured to supply a dry solvent such as IPA (isopropyl alcohol). As the hydrofluoric chemical liquid, BHF (solution containing mixture of HF and $NH_4F$) and LAL (solution containing mixture of BHF and a surfactant) may be used, in place of the aforementioned diluted hydrofluoric acid (DHF).

The process-liquid flow path 35 is communicated with the DHF supply source 41, the SC1 supply source 42, and the DIW supply source 45, via a first valve 46, a second valve 47, and a third valve 48, respectively. The dry-solvent flow path 38 is communicated with the IPA supply source 43 via a fourth valve 49.

In FIG. 3, when only the first valve 46 is opened so that the process-liquid flow path 35 and the DHF supply source 41 are communicated with each other, the process-liquid supplying mechanism 30 supplies diluted hydrofluoric acid (DHF) as a chemical liquid for a cleaning process. In this manner, a first chemical-liquid supplying mechanism for supplying a hydrofluoric process liquid is composed of the nozzle block 31 having the nozzles 31a and 31b, the nozzle arm 32, the nozzle swinging shaft 33, the process-liquid flow path 35, the nozzle driving part 75 (see, FIG. 2), the first valve 46, and the DHF supply source 41.

On the other hand, in FIG. 3, when only the second valve 47 is opened so that the process-liquid flow path 35 and the SC1 supply source 42 are communicated with each other, the process-liquid supplying mechanism 30 supplies ammonia peroxide mixture as a chemical liquid for a cleaning process. In this manner, a second chemical-liquid supplying mechanism for supplying an alkaline process liquid is composed of the nozzle block 31 having the nozzles 31a and 31b, the nozzle arm 32, the nozzle swinging shaft 33, the process-liquid flow path 35, the nozzle driving part 75 (see, FIG. 2), the second valve 47, and the SC1 supply source 42.

In FIG. 3, a drying-liquid supplying mechanism for supplying an IPA (organic solvent) for drying a wafer W is composed of the nozzle block 31 having the nozzles 31*a* and 31*b*, the nozzle arm 32, the nozzle swinging shaft 33, the dry-solvent flow path 38, the nozzle driving part 75 (see, FIG. 2), the fourth valve 49, and the IPA supply source 43.

In FIG. 3, when only the third valve 48 is opened so that the DIW supply source 45 is communicated with the process-liquid flow path 35, the process-liquid supplying mechanism 30 supplies deionized water (cleaning liquid) as a rinse liquid of a chemical liquid. Thus, a cleaning-liquid supplying mechanism for supplying deionized water (rinse liquid of chemical liquid) to a wafer W held on the substrate holding mechanism 20 is composed of the nozzle block 31 having the nozzles 31*a* and 31*b*, the nozzle arm 32, the nozzle swinging shaft 33, the process-liquid flow path 35, the nozzle driving part 75 (see, FIG. 2), the third valve 48, and the DIW supply source 45.

A mechanism that supplies a process liquid to the rear-surface process-liquid supply path 26 shown in FIGS. 2 and 4 has the same structure as that of the aforementioned process-liquid supplying mechanism 40 excluding that the mechanism is not equipped with the IPA supply source 43.

As shown in FIGS. 2 and 4, the draining pipe 13 has a blocking valve (blocking mechanism) 11 that stops flowing of a process liquid passing through the draining pipe 13. By closing the blocking valve 11, the draining pipe 13 can be blocked. Thus, as described below, when deionized water D is supplied by the cleaning-liquid supplying mechanism, by blocking the draining pipe 13 by means of the blocking valve 11, the deionized water D can be stored in the draining pipe 13 and the draining cup 12 to thereby supply the deionized water D to the draining cup 12. Thus, a cleaning mechanism (removing mechanism) 10 that supplies deionized water D to the draining cup 12 is composed of the cleaning-liquid supplying mechanism, the draining pipe 13, and the blocking valve 11.

As shown in FIGS. 2 and 3, a control part 50 is connected to the respective first valve 46, the second valve 47, the third valve 48, the fourth valve 49, and the blocking valve 11, and the respective first chemical-liquid supplying mechanism, the drying-liquid supplying mechanism, and the blocking valve 11 are controlled by the control part 50.

As shown in FIG. 4, on a side of the rotating shaft 23 near the exhaust pipe 67, there is disposed an inner discharge pipe 68 that receives a process liquid (deionized water D in FIG. 4) leaked from a part between a wafer W and the substrate holding mechanism 20, and discharges the process liquid outside. In addition, below the exhaust cup 66, there is disposed an outer discharge pipe 69 that receives a process liquid (deionized water D in FIG. 4) flowing into a space 66*a* in which the exhaust cup 66 is disposed, and discharges the process liquid outside.

As shown in FIG. 2, connected to an upper wall of the casing via a valve 19 is a dry-gas supplying part 18 that supplies a dry gas such as air of a low humidity or $N_2$.

Next, an operation of this embodiment as structured above is described. To be specific, there is described a liquid processing method performed by the liquid processing apparatus 1 in this embodiment so as to clean a wafer W.

At first, a wafer W held by the main arm 84 is loaded into the casing 5 of the liquid processing apparatus 1 via the inlet/outlet port 5*a*. Then, the thus transferred wafer W is delivered to the wafer supporting pin 28 provided on the wafer supporting table 27, with the elevating member 25 being elevated. Thereafter, the elevating member 25 is lowered, and the wafer W is chucked and held by the holding member 22 (holding step) (see, FIGS. 1, 2, and 4).

Then, the wafer W held by the substrate holding mechanism 20 is rotated integrally with the rotating cup 61 by the rotating mechanism 70 (rotating step) (see, FIGS. 2 and 4). Until a drying step, which is described below, is finished, the wafer W and the rotating cup 61 continue to be rotated.

More specifically, by rotating the motor shaft 71*a* of the motor 71 to rotate the belt 72 wound around the motor shaft 71*a* and around the lower end of the rotating shaft 23, the rotating shaft 23 is rotated. Since the rotating cup 61 is integral with the substrate holding mechanism 20, the rotation of the rotating shaft 23 can rotate the rotating cup 61 integrally with the substrate holding mechanism 20.

At this time, a process liquid is supplied to the wafer W held by the substrate holding mechanism 20 by the process-liquid supplying mechanism 30 (process-liquid supplying step) (see, FIGS. 2 to 4). To be specific, in the process-liquid supplying step, the following steps are performed. Before the process-liquid supplying step is started, all the valves 46, 47, 48, and 49 are closed (see, FIG. 3).

Firstly, based on a signal from the control part 50, the second valve 47 is opened, so that ammonia peroxide mixture is supplied from the SC1 supply source 42. Then, the ammonia peroxide mixture is supplied to the wafer W held by the substrate holding mechanism 20 through the nozzle 31*a* (second chemical-liquid supplying step 91) (see, FIGS. 3 and 5).

Then, based on a control signal from the control part 50, the second valve 47 is closed and the third valve 48 is opened, so that deionized water D is supplied from the DIW supply source 45. Then, the deionized water D is supplied to the wafer W through the nozzle 31*a* (rinsing step 92) (see, FIGS. 3 to 5).

After the deionized water D is supplied to the wafer W for a predetermined period (e.g., about 10 seconds), the blocking valve 11 is closed based on a signal from the control part 50 (cleaning step 93) (see, FIGS. 2 to 5). By closing the blocking valve 11, the flow of the deionized water D passing through the draining pipe 13 can be stopped. Thus, the deionized water D is stored in the draining pipe 13 and the draining cup 12 to bathe the draining cup 12. In this manner, the deionized water D can be supplied to the draining cup 12. Thus, an ammonia component (alkaline component) adhering to the draining cup 12 can be removed.

According to this embodiment, only by closing the blocking valve 11 in the rinsing step 92 that is performed after the ammonia peroxide mixture has been supplied, the deionized water D is supplied to the draining cup 12 whereby the ammonia component adhering to the draining cup 12 can be removed (see, FIG. 4). In a case where the surface of a wafer W is processed by a hydrofluoric process liquid and thereafter exposed to an organic solvent, marks may be generated by the presence of only a slight amount of ammonia component in the casing 5. However, such a generation of marks can be easily prevented by the inexpensive structure.

In addition, the deionized water D is stored in the draining pipe 13 and the draining cup 12, and the draining cup 12 can be bathed with the deionized water D (see, FIG. 4). Thus, the ammonia component adhering to the draining cup 12 can be reliably cleaned and removed, so that the generation of marks on a wafer W can be prevented with a high probability.

After the supply of the deionized water D to the draining cup 12 as described above, the blocking valve 11 is opened based on a signal from the control part 50 (FIGS. 2 and 4). Thus, the deionized water D filled in the draining cup 12 is removed from the draining cup 12.

Then, based on a signal from the control part 50, the third valve 48 is closed and the first valve 46 is opened, so that diluted hydrofluoric acid is supplied from the DHF supply source 41. Then, the diluted hydrofluoric acid is supplied the wafer W through the nozzle 31*a* (first-chemical supplying step 95) (see, FIGS. 2 to 5).

Then, based on a signal from the control part 50, the first valve 46 is closed and the third valve 48 is opened, so that deionized water D is supplied from the DIW supply source 45. Then, the deionized water D is supplied to the wafer W by the substrate holding mechanism 20 through the nozzle 31*a* (rinsing step 97) (see, FIGS. 2 to 5).

Figure 5:
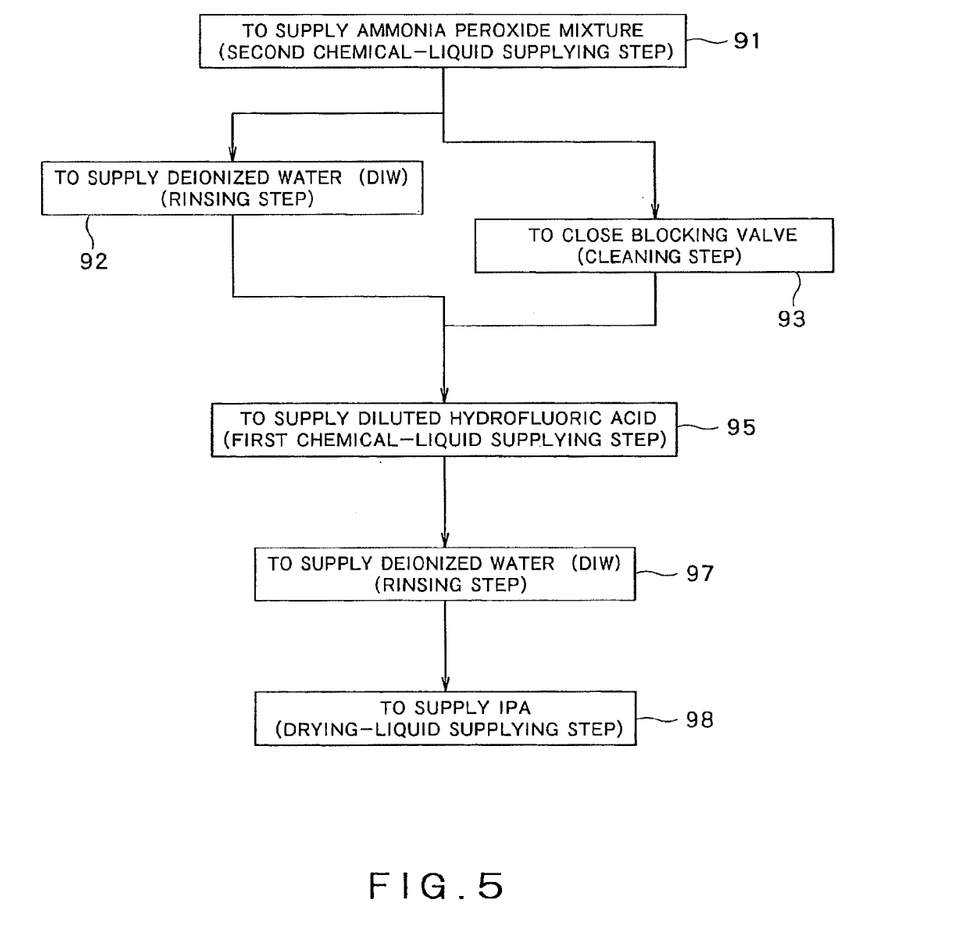
FIG. 5 is a flowchart showing a part of steps included in a liquid processing method in the first embodiment of the present invention.

In the rinsing step 97, the gas flowing into the casing 5 is switched from the clean air supplied from the FFU to a dry gas, such as air of low humidity or $N_2$, which is supplied from the dry-gas supplying part 18. Due to the supply of the dry gas into the casing 5, humidity in the casing 5 can be reduced, whereby formation of watermarks on the wafer W can be prevented.

Then, based on a signal from the control part 50, the third valve 48 is closed, and thereafter the fourth valve 49 is opened so that IPA for drying the wafer W is supplied to the wafer W through the nozzle 31*b* (drying-liquid supplying step 98) (see, FIGS. 2 to 5).

At this time, the nozzle swinging shaft 33 is driven by the nozzle driving part 75, so that the nozzles 31*a* and 31*b* of the nozzle block 31 disposed on the nozzle arm 32 are swung about the nozzle swinging shaft 33 above the wafer W along the surface of the wafer W (see, FIGS. 1 and 2).

After the supply of the IPA to the wafer W as described above, the wafer W held by the substrate holding mechanism 20 is rotated at a speed higher than a speed of the drying-liquid supplying step 98. Thus, the IPA adhering to the wafer W is spun off from the wafer W to thereby dry the wafer W (drying step).

In the respective aforementioned process-liquid supplying steps, the rotating cup 61 is rotated integrally with the substrate holding mechanism 20. Thus, when the process liquid spun off from the wafer W contacts the rotating cup 61, a centrifugal force acts on the process liquid. Accordingly, the process liquid is resistant to be scattered outside to become mist.

Finally, after the chucking by the holding member 22 is released, the processed wafer W is removed from the substrate holding mechanism 20 and is unloaded from the casing 5 to the outside via the inlet/outlet port 5*a* (see, FIG. 2).

In the above embodiment, in the rinsing step 92 after the second chemical-liquid supplying step 91 in which the ammonia peroxide mixture is supplied, the blocking valve 11 is closed to store the draining cup 12 with the deionized water D. However, the present invention is not limited thereto. For example, in the rinsing step 97 after the first chemical-liquid supplying step 95 in which the diluted hydrofluoric acid is supplied, the blocking valve 11 may be closed so as to supply the deionized water D to the draining cup 12. However, since the surface of the wafer W is activated after the supply of the diluted hydrofluoric acid, there is a possibility that the deionized water D and the surface of the wafer W produce an unnecessary reaction in the cleaning step in which the wafer W may be immersed in the deionized water D. Therefore, as described above, it is preferable that the blocking valve 11 is closed and the cleaning step 93 is performed in the rinsing step 92 after the second chemical-liquid supplying step 91 in which the ammonia peroxide mixture is supplied.

In the above-described embodiment, the ammonia component is taken as an example of the alkaline component. However, not limited thereto, the ammonia component may be replaced with another alkaline component.

According to this embodiment, there can be provided a computer program executable by the computer 55 to perform the above liquid processing method, and a storage medium 55*a* storing such a computer program (see, FIG. 2). In this embodiment, the computer 55 can communicate with the control part 50.

In addition, given herein as an example to describe the above embodiment is a case where the one exhaust pipe 67 for discharging outside the clean air having passed through the exhaust cup 66 is connected to the exhaust cup 66. However, not limited thereto, a plurality of (e.g., two) exhaust pipes may be connected to the exhaust cup 66.

By connecting to the exhaust cup 66 a plurality of exhaust pipes for discharging outside the clean air having passed through the exhaust cup 66, the ammonia component in the ammonia peroxide mixture, which has been supplied from the second chemical-liquid supply step 91, can be more reliably discharged from the casing 5. Thus, the generation of marks on the wafer W can be more reliably prevented.

In addition, given herein as an example to describe the above embodiment is a case where the diluted hydrofluoric acid supplied from the DHF supply source 41 and the ammonia peroxide mixture supplied from the SC1 supply source 42 are supplied to the wafer W by using the one nozzle arm 32 and the one nozzle block 31 having the nozzles 31*a* and 31*b*. However, not limited thereto, the diluted hydrofluoric acid supplied from the DHF supply source 41 and the ammonia peroxide mixture supplied from the SC1 supply source 42 may be respectively supplied to the wafer W by using nozzle arms for exclusive use and nozzle blocks (including nozzles) for exclusive use.

In the first embodiment shown in FIGS. 1 to 5, the DHF supply source 41 and the SC1 supply source 42 supply the process liquids to the wafer W by using the same nozzle arm 32 and the same nozzle block 31 (including nozzles 31*a* and 31*b*). Thus, there cannot be eliminated a possibility in which the ammonia component (although it is very slight), which has been used in the second chemical-liquid supply step 91 and has adhered to outer surfaces of the nozzle arm 32 and the nozzle block 31 (including nozzles 31*a* and 31*b*), adheres to the wafer W in the steps following to the cleaning step 93. As described above, the presence of only a slight amount of ammonia component may invite the generation of marks on the wafer W, the possibility that marks are generated on the wafer W by the ammonia component cannot be denied.

However, when the diluted hydrofluoric acid supplied from the DHF supply source 41 and the ammonia peroxide mixture supplied from the SC1 supply source 42 are respectively supplied to the wafer W by using the nozzle arms for exclusive use and the nozzle blocks (including the nozzles) for exclusive use, these nozzle arms and the nozzle blocks (including the nozzles) can be moved to standby positions at a time point when the second chemical-liquid supplying step 91 is finished. Therefore, upon the finish of the second chemical-liquid supplying step 91 and subsequently thereto, the nozzle arm and the nozzle block (including the nozzle), which have been used for supplying the ammonia peroxide mixture, can be moved to a position separate from the wafer W. As a result, it is possible to prevent the ammonia component adhering to the outer surfaces of the nozzle arm and the nozzle block (including the nozzle) from adhering to the wafer W, whereby the generation of marks on the wafer W can be more reliably prevented.

Second Embodiment

Next, a second embodiment of the present invention is described with reference to FIG. 6. In the second embodiment shown in FIG. 6, a cleaning mechanism (removing mechanism) 10 that removes an alkaline component adhering to a draining cup 12 is constituted, in place of the cleaning-liquid supplying mechanism, the draining pipe 13, and the blocking valve 11, by a cleaning-liquid jetting mechanism 15 that jets deionized water (cleaning liquid.) D to the draining cup 12 so as to remove the alkaline component adhering to the draining cup 12. Further, an annular exhaust cup 66 located on an outer peripheral side of the draining cup 12 is capable of being moved in an up and down direction (see, arrow A2 in FIG. 6). Other structures of the second embodiment are substantially the same as those of the first embodiment shown in FIGS. 1 to 5.

Figure 6:
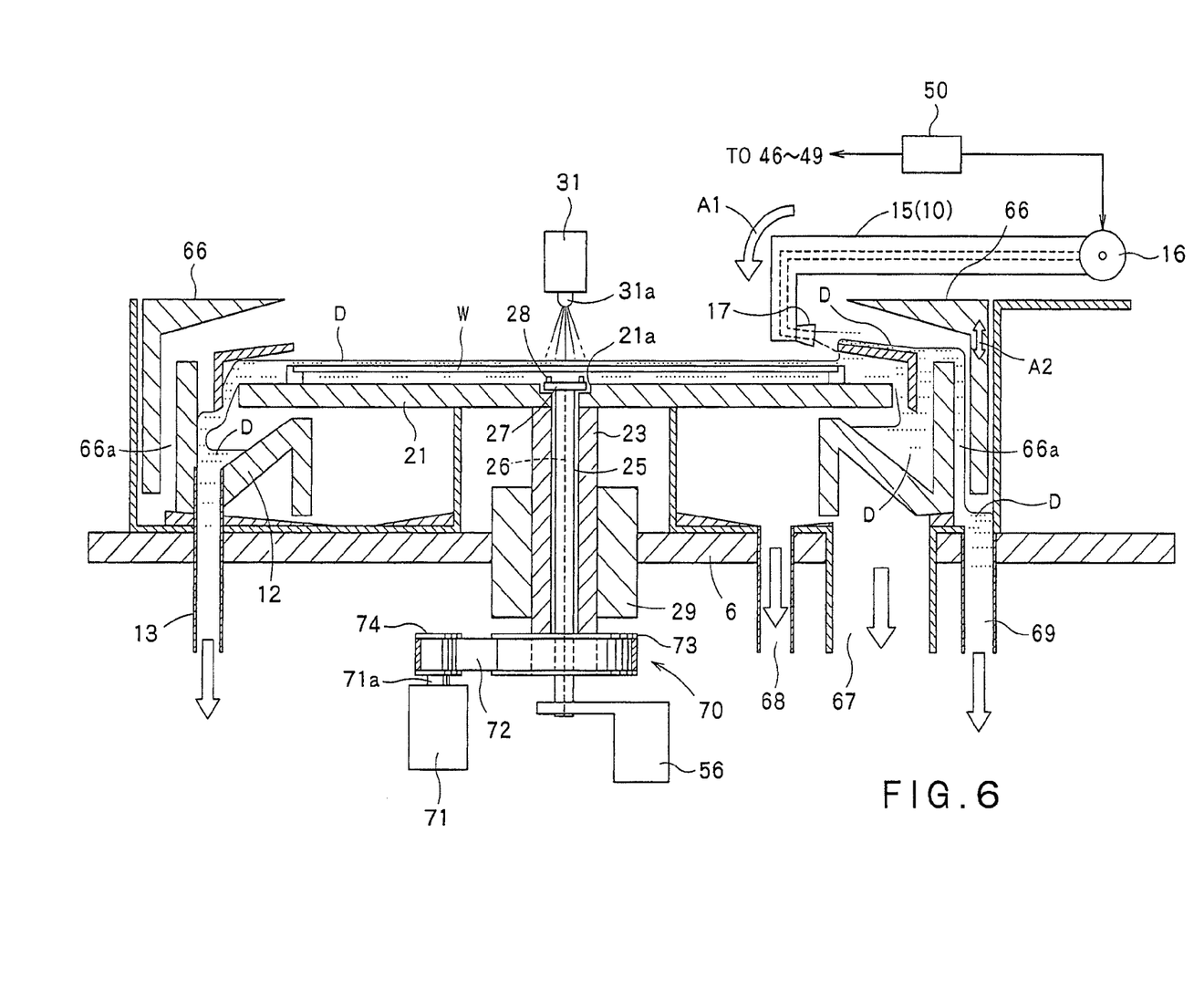
FIG. 6 is a longitudinal sectional view of a liquid processing apparatus in a second embodiment of the present invention, showing the section corresponding to the section shown in FIG. 4.

In the second embodiment shown in FIG. 6, the same parts as those of the first embodiment shown in FIGS. 1 to 5 have the same reference numbers, and a detailed description thereof is omitted.

As shown in FIG. 6, the cleaning-liquid jetting mechanism 15 is positioned so as to be swingable in the up and down direction about a swinging shaft 16 in a casing 5. The cleaning-liquid jetting mechanism 15 is provided with a jetting nozzle 17 that jets deionized water D toward the draining cup 12.

Further, as shown in FIG. 6, a control part 50 is connected to the cleaning-liquid jetting mechanism 15, so that the cleaning-liquid jetting mechanism 15 is controlled by the control part 50.

An operation of the cleaning-liquid jetting mechanism 15 is described below.

At first, during the second chemical-liquid supplying step 91 in which ammonia peroxide mixture is supplied, the jetting nozzle 17 of the cleaning-liquid jetting mechanism 15 is located on an upper position. At this time, the exhaust cup 66 is also located on an upper position.

Then, when a predetermined period has elapsed from when the rinsing step 92 is started after the second chemical-liquid supplying step 91 was finished, the exhaust cup 66 starts to be moved downward.

After that, based on a signal from a control part 50, the jetting nozzle 17 is swung about a swinging shaft 16 (see, arrow A1 in FIG. 6), so as to be located on a lower position (position shown in FIG. 6). Then, based on a signal from the control part 50, deionized water D is jetted toward the draining cup 12 from the jetting nozzle 17 located on the lower position, whereby the ammonia component (alkaline component) adhering to the draining cup 12 is removed (see, FIG. 6).

According to this embodiment, in the rinsing step 92 which is performed after the ammonia peroxide mixture has been supplied, by jetting a cleaning liquid from the jetting nozzle 17 located on the lower position toward the draining cup 12, the cleaning liquid is supplied to the draining cup 12 so that the ammonia component adhering to the draining cup 12 can be removed. Thus, the generation of marks on the wafer W, which may result from only a slight amount of the ammonia component in the casing 5, can be easily prevented.

Then, the rinsing step 92 which is performed after the ammonia has been supplied is finished, and thereafter the jetting nozzle 17 is swung about the swinging shaft 16 to reach the upper position, based on a signal from a control part 50.

Following thereto, similarly to the first embodiment, a first chemical-liquid supplying step 95, a rinsing step 97, and a drying-liquid supplying step 98 are sequentially performed (see, FIG. 5).

Although given herein is an example to describe the above embodiment is a case where the cleaning mechanism (removing mechanism) 10 formed of the cleaning-liquid jetting mechanism 15 is used in place of the cleaning mechanism (removing mechanism) 10 shown in the first embodiment, the present invention is not limited thereto. It is possible to constitute the cleaning mechanism (removing mechanism) 10 by adding the cleaning-liquid jetting mechanism 15 to the first embodiment.

Third Embodiment

Next, a third embodiment of the present invention is described with reference to FIG. 7. In the third embodiment shown in FIG. 7, in place of the provision of the cleaning mechanism 10 that removes the alkaline component in the casing 5, a dry-gas supplying part 18 serves as a pressurizing mechanism (invasion preventing mechanism) that prevents invasion of an alkaline component into a casing 5. Specifically, an air pressure of a dry gas flowing into the casing 5 from the dry-gas supplying part 18 is increased to thereby prevent the invasion of an alkaline component into the casing 5. Other structures of the third embodiment are substantially the same as those of the first embodiment shown in FIGS. 1 to 5.

Figure 7:
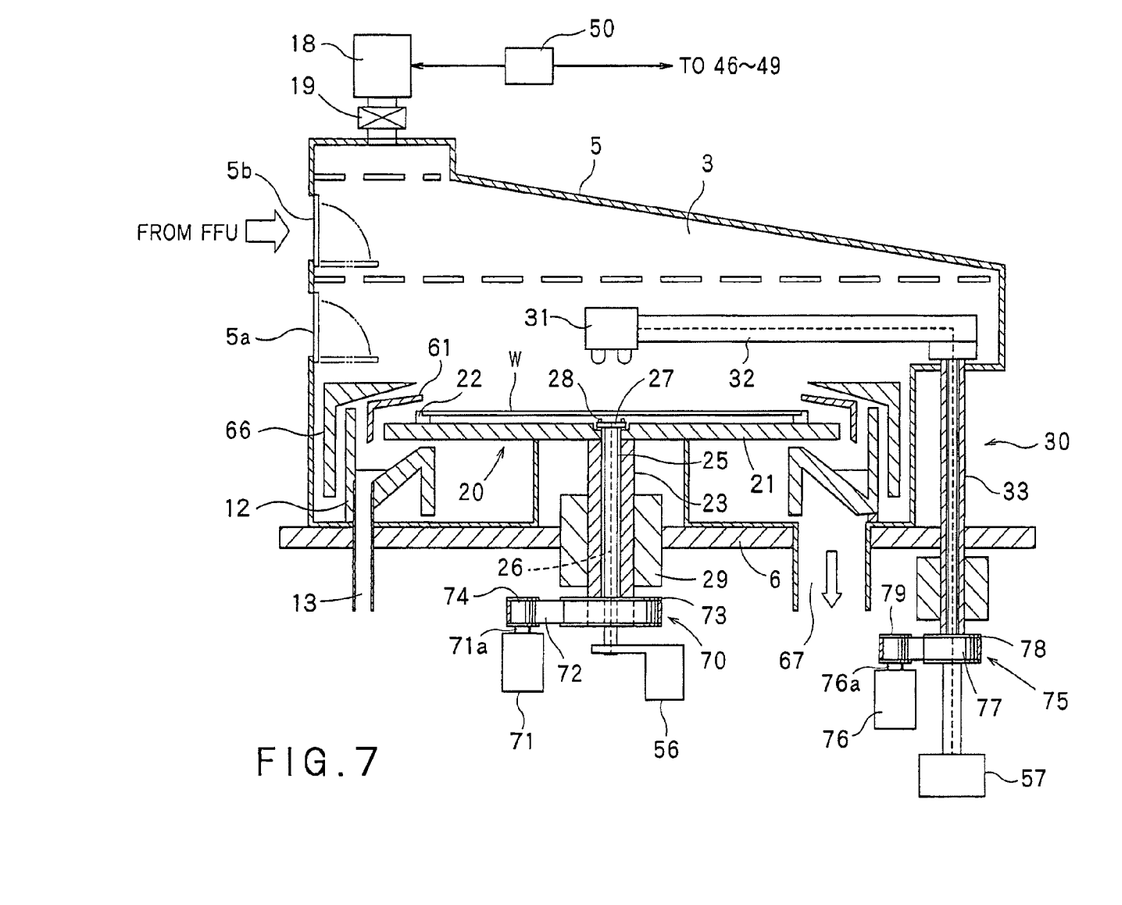
FIG. 7 is a longitudinal sectional view of a liquid processing apparatus in a third embodiment of the present invention.

In the third embodiment shown in FIG. 7, the same parts as those of the first embodiment shown in FIGS. 1 to 5 have the same reference numbers, and a detailed description thereof is omitted.

As shown in FIG. 7, connected to the casing 5 is a pressurizing mechanism 18 that prevents invasion of an alkaline component such as an ammonia component into the casing 5 by increasing an air pressure in the casing 5. The pressurizing mechanism 18 is connected to a control part 50, and is controlled based on a signal from the control part 50.

As described above, in a case where the surface of a wafer W is processed by a hydrofluoric process liquid and is then exposed to an organic solvent, the presence of only a slight amount of ammonia component may cause the generation of marks on the wafer W. However, in this embodiment, the air pressure in the casing 5 can be raised by the dry-gas supplying part 18, whereby the invasion of an ammonia component which is present in an outside air (air in a clean room) into the casing 5 can be prevented. Thus, even when the wafer W is dried by an organic solvent after the wafer has been processed by a hydrofluoric process liquid, the generation of marks on the wafer W can be easily prevented.

The step of preventing the invasion of an alkaline component into the casing 5 by increasing the air pressure in the casing 5 (invasion preventing step) is continuously performed from a time point when a wafer W to be processed is placed on a substrate holding mechanism 20 in the casing 5 to a time point when the processed wafer W is unloaded from the casing 5 to the outside (see, FIG. 2).

The dry-gas supplying part 18 functioning as the pressurizing mechanism (invasion preventing mechanism) in this embodiment does not have the SC1 supply source 42 that supplies ammonia peroxide mixture (SC1) that is an alkaline process liquid, and thus the dry-gas supplying part 18 is effective when no ammonia peroxide mixture (SC1) is supplied.

Although given herein is an example to describe the above embodiment is a case where the dry-gas supplying part 18 that raises the air pressure in the casing 5 is used as the invasion preventing mechanism for preventing the invasion of an alkaline component into the casing 5, the present invention is not limited thereto. As long as the invasion of an alkaline component into the casing 5 is prevented, any mechanism may be used as the invasion preventing mechanism.

In the foregoing description, although the respective the first embodiment, the second embodiment, and the third embodiment are separately described, the two embodiments may be optionally combined, or all the three embodiments may be combined.

The invention claimed is:

1. A liquid processing method using a liquid processing apparatus having a casing; a substrate holding mechanism disposed in the casing, the substrate holding mechanism being configured to hold a substrate to be processed; a process-liquid supplying mechanism configured to supply a process liquid to the substrate to be processed held by the substrate holding mechanism; a draining cup configured to cover the substrate to be processed held by the substrate holding mechanism in the casing from an outer peripheral side, the draining cup being configured to receive a process liquid that has been used for cleaning the substrate to be processed; and a draining pipe connected to the draining cup, the draining pipe being configured to discharge outside the process liquid having passed through the draining cup, the liquid processing method comprising:

a holding step in which the substrate to be processed is held by the substrate holding mechanism;

a rotating step in which the substrate to be processed held by the substrate holding mechanism is rotated by the rotating mechanism; and a process-liquid supplying step in which a process liquid is supplied by the process-liquid supplying mechanism to the substrate to be processed held by the substrate holding mechanism, wherein:

the process-liquid supplying step includes: a second chemical-liquid supplying step, in which an alkaline process liquid is supplied; a first chemical-liquid supplying step after the second chemical-liquid supplying step, in which a hydrofluoric process liquid is supplied; and a drying-liquid supplying step, after the first chemical-liquid supplying step, in which an organic solvent for drying the substrate to be processed is supplied; and after the second chemical-liquid supplying step and before the drying-liquid supplying step, there is performed a removing step in which an alkaline component adhering to the draining cup is removed by supplying a cleaning liquid to the draining cup.

2. The liquid processing method according to claim 1, wherein a flow of the cleaning liquid, which has been supplied from the process-liquid supplying mechanism and passes through the draining pipe, is stopped by means of a blocking mechanism disposed in the draining pipe, so that the process liquid is stored in the draining pipe and the draining cup whereby the cleaning liquid is supplied to the draining cup, so as to remove the alkaline component adhering to the draining cup.

3. The liquid processing method according to claim 1, wherein the cleaning step removes the alkaline component adhering to the draining cup, by jetting a cleaning liquid to the draining cup.

* * * * *